(12) United States Patent
Tuan et al.

(10) Patent No.: US 6,674,669 B2
(45) Date of Patent: Jan. 6, 2004

(54) NONVOLATILE MEMORY STRUCTURES AND ACCESS METHODS

(75) Inventors: Hsing T. Tuan, Cupertino, CA (US); Li-Chun Li, Los Gatos, CA (US); Vei-Han Chan, San Jose, CA (US)

(73) Assignee: Mosel Vitelic, Inc., Hsin Chu (TW)

( * ) Notice: Subject to any disclaimer, the term of this patent is extended or adjusted under 35 U.S.C. 154(b) by 0 days.

(21) Appl. No.: 10/268,863

(22) Filed: Oct. 9, 2002

(65) Prior Publication Data

US 2003/0067808 A1 Apr. 10, 2003

Related U.S. Application Data

(62) Division of application No. 09/972,388, filed on Oct. 5, 2001.

(51) Int. Cl.$^7$ .............................................. G11C 11/34
(52) U.S. Cl. .............................. 365/185.28; 365/185.18
(58) Field of Search ........................ 365/188.28, 185.18

(56) References Cited

U.S. PATENT DOCUMENTS

| | | | |
|---|---|---|---|
| 5,400,276 A | * 3/1995 | Takeguchi | 365/149 |
| 5,668,757 A | 9/1997 | Jeng | 365/185.1 |
| 5,912,843 A | 6/1999 | Jeng | 365/185.14 |
| 6,134,144 A | 10/2000 | Lin et al. | 365/185.14 |
| 6,243,298 B1 | 6/2001 | Lee et al. | 365/185.28 |
| 6,265,266 B1 | 7/2001 | Dejenfelt et al. | 438/258 |
| 6,326,661 B1 | 12/2001 | Dormans et al. | 257/315 |
| 6,355,524 B1 | 3/2002 | Tuan et al. | 438/257 |

OTHER PUBLICATIONS

Betty Prince, "Semiconductor Memories", 1983, Wiley, 2$^{nd}$ edition, pp. 174 and 175.*

* cited by examiner

*Primary Examiner*—M. Tran
(74) *Attorney, Agent, or Firm*—Michael Shenker; MacPherson Kwok Chen & Heid LLP (57) ABSTRACT

In each row of a nonvolatile memory array, the select gates of all the memory cells are connected together and are used to select a row for memory access. The control gates of each row are also connected together, and the source regions of each row are connected together. Also, the control gates of plural rows are connected together, and the source regions of plural rows are connected together, but if the source regions of two rows are connected together, then their control gates are not connected together. If one of the two rows is being accessed but the other one of the two rows is not being accessed, their control gates are driven to different voltages, reducing the probability of a punch-through in the non-accessed row.

15 Claims, 10 Drawing Sheets

Page 0 Decoders

NONVOLATILE MEMORY STRUCTURES AND ACCESS METHODS

CROSS REFERENCE TO RELATED APPLICATIONS

The present application is a division of U.S. patent application Ser. No. 09/972,388 filed on Oct. 5, 2001, incorporated herein by reference.

BACKGROUND OF THE INVENTION

The present invention relates to nonvolatile memories.

Figure 1:
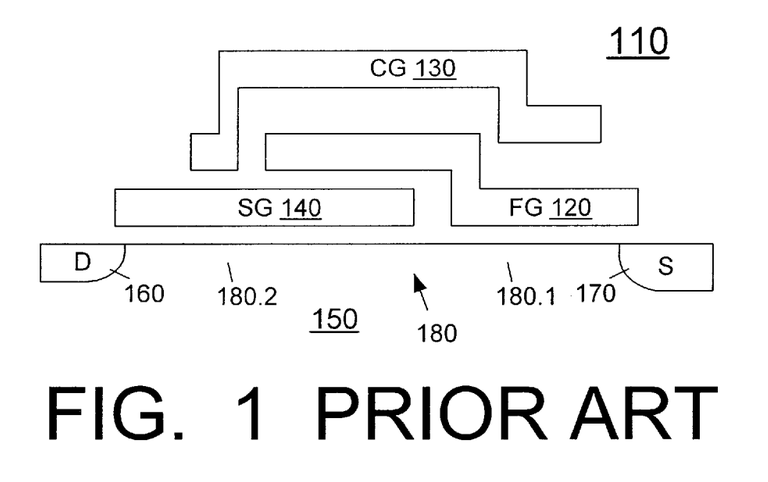
FIG. 1 shows a cross section of a prior art flash memory cell.

FIG. 1 shows a cross section of a flash memory cell 110 disclosed in U.S. Pat. No. 6,134,144 issued Oct. 17, 2000 to Lin et al. Floating gate 120, control gate 130, and select gate 140 are formed over semiconductor substrate 150. Drain 160 and source 170 are N type doped regions formed in substrate 150 adjacent to select gate 140 and floating gate 120 respectively. P type doped channel region 180 extends in substrate 150 between source 170 and drain 160. The gates 120, 130, 140 are insulated from each other and the substrate by insulating layers.

The cell is programmed by hot electron injection as the control gate 130 is held at a super high voltage of 12 V, select gate 140 is held at 1 V, drain 160 is held at 0 V, and source 170 is held at 5 to 8 V. Hot electrons are injected from channel 180 into floating gate 120 to negatively charge the floating gate.

The cell is erased by Fowler-Nordheim tunneling of electrons from floating gate 120 to source 170 as source 170 is held at 12 V and control gate 130, drain 160, and select gate 140 are at 0 V.

Figure 2:
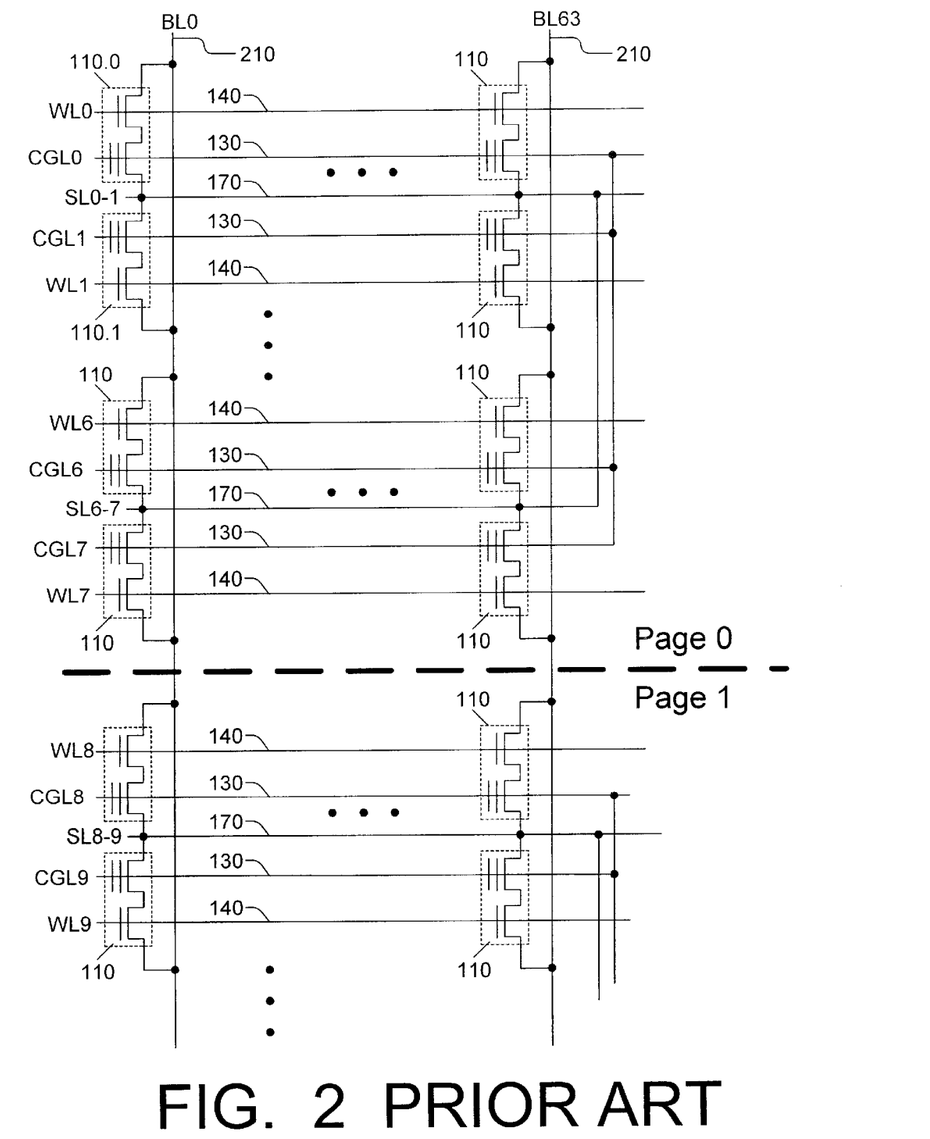
FIG. 2 is a block-circuit diagram of a prior art flash memory array.

FIG. 2 is a circuit diagram of a flash memory array formed with the cells of FIG. 1. Each cell 110 is shown schematically as an NMOS transistor and a floating gate transistor connected in series. In each row of the array, the select gates 140 are provided by a polysilicon wordline. The wordlines of rows 0, 1, etc. are shown respectively as WL0, WL1, etc., and are also referenced as 140. In each row, control gates 130 are also provided by a polysilicon line ("control gate line"). The control gate lines of rows 0, 1, etc. are shown as CGL0, CGL1, etc., and are also referenced as 130. Each control gate line CGLi (i=0, 1, . . . ) is in the same row "i" as wordline WLi.

In each row, source regions 170 are formed as a diffusion line ("source line") in substrate 150. Every two adjacent rows share a source line. Thus, rows 0 and 1 share source line SL0-1, rows 2 and 3 share source line SL2-3, and so on.

Metal bitlines BL0, . . . BL63, also referenced as 210, are perpendicular to the wordlines, the control gate lines, and the source lines. Each bitline is connected to drains 160 of a column of the memory cells.

Decoders (not shown) are positioned on the sides of the array to supply appropriate signals to the wordlines, the control gate lines and the source lines. Additional circuitry (not shown) supplies appropriate signals to the bitlines for the erase and program operations, and connects the bitlines to sense amplifiers (not shown) during the read operations.

The memory array is organized as a number of pages. A page contains eight rows whose source lines 170 are connected together. For example, the source lines SL0-1, SL2-3, SL4-5, SL6-7 of rows 0–7 are connected together. The eight control gate lines 130 of each page are also connected together. The individual rows are selected by activating the associated wordlines.

SUMMARY

Connecting together the control gate lines 130 of each page reduces the size of the decoding circuitry needed to select a control gate line. However, the memory cells become more vulnerable to punch-through during programming. Suppose for example that cell 110.0 in row 0, column 0 is being programmed. Control gate line CGL0 is at 12 V, wordline WL0 is at 1 V, source line SL0-1 is at 5 to 8 V, and bitline BL0 is at 0 V. Word lines WL1, WL2, etc. are at 0 V. During programming, the unselected cell 110.1 has the following voltages on its terminals: its control gate 130 is at 12 V, source 170 at 5 to 8 V, drain 160 at 0 V, and select gate 140 at 0 V. Consequently, the voltage on source 170 is passed along channel portion 180.1 underlying the floating gate, and a 5 to 8 V potential difference appears across channel portion 180.2 underlying select gate 140. As a result, the cell may experience a high leakage current. In addition, the cell may suffer a punch-through, with a high current flowing from the drain to the source. To reduce the probability of a punch-through, one can increase the length of select gate 140, but this undesirably increases the cell size. One can also increase the doping level of channel 180, but this undesirably reduces the cell current when the cell is selected for reading or programming.

Figure 3:
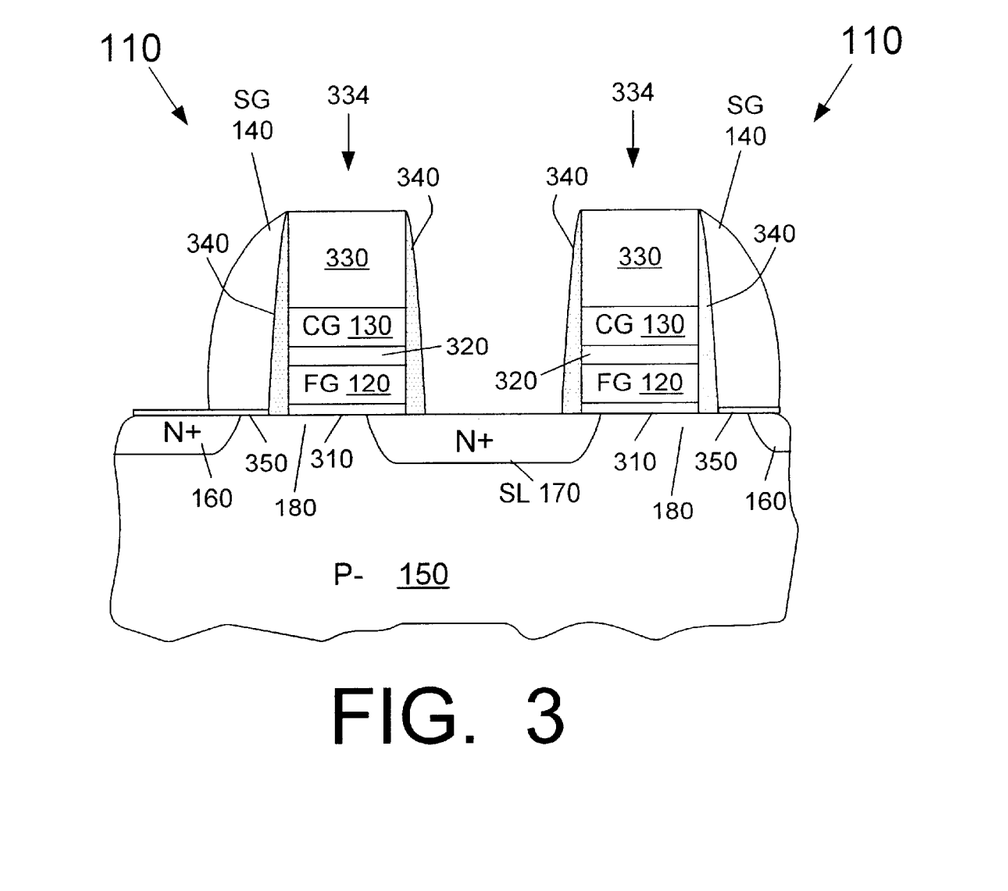
FIG. 3 shows a cross section of a flash memory cell.

The punch-through problem is particularly dangerous for the memory cells in which the select gate is formed as a sidewall spacer because the length of the select gate can be less than one feature size (a feature size is a minimum line width obtainable with the photolithographic processes used in the memory fabrication). Two such cells sharing a source line 170 are shown in FIG. 3. The cells are manufactured as described in U.S. Pat. No. 6,355,524 issued Mar. 12, 2002 to H. T. Tuan et al., entitled "Nonvolatile Memories and Methods of Fabrication", incorporated herein by reference. Briefly, insulating layer 310 is formed on a P-doped region of monocrystalline silicon substrate 150. Doped polysilicon layer 120 is formed on insulator 310. Then polysilicon 120 (the floating gate layer) is removed between different columns of the array so that the floating gates of different columns would not be connected to each other. The floating gates within each column remain connected to each other at this stage.

Insulator 320 is formed on layer 120. Doped polysilicon 130 is formed on insulator 320. Silicon nitride 330 is formed on polysilicon 130. Then layers 330, 130, 320, 120, 310 are etched to form stacks 334 extending along each row of the array. In each stack, polysilicon 130 provides a control gate line. Polysilicon 120 is removed between the rows during this etch, so the floating gates 120 become fully isolated from each other.

Insulator 340 is formed on the sidewalls of each stack 334. (Layer 340 may include thermally grown silicon dioxide and may also include silicon nitride spacers formed by conformal deposition and a maskless etch of silicon nitride.) Silicon dioxide 350 is grown on the exposed portions of substrate 150.

Conformal polysilicon layer 140 is deposited and etched anisotropically to form spacers on the sidewalls of each stack 334. The etch does not require a mask over the memory array. Then a masked etch of polysilicon 140 removes the spacers on the source line side of each stack. The spacer on the drain side of the stack provides a wordlines WLi for the corresponding row. Source lines 170 and drain regions 160 are doped at suitable steps during fabrication.

The memory cells of FIG. 3 can be individually programmed by hot electron injection from channel region 180 to the floating gate. The cells connected to the same source line 170 (a "sector") can be erased together by Fowler-Nordheim tunneling from the floating gates 120 to the source line 170 or substrate 150. In one embodiment, the following voltages can be used for the memory operation:

TABLE 1

|  | Program | Sector erase through source line | Sector erase through substrate | Read |
|---|---|---|---|---|
| Control gate 130 | +10 V/0 V | −10 V | −10 V | 1.8 V |
| Drain 160 | 0 V/V3** (VCC = 1.8 V) | V4*** (VCC = 1.8 V) | Float | 1.5 |
| Source line 170 | 6 V | 5 V | Float | 0 V |
| Select gate 140 | VTN + ΔV1* | 0 V | 0 V | VCC + ΔV2* (VCC = 1.8 V) |
| Substrate 150 | 0 V | 0 V | 6 V | 0 V |

Notes to Table 1:
*In some embodiments, VTN = 0.6 V, ΔV1 = 0.9 V, ΔV2 = 1.4 V.
**V3 is a voltage above ΔV1.
***V4 is some voltage such that 0 < V4 < VCC.

Slashes are used in Table I to indicate the voltages for selected/non-selected memory rows or columns. For example, in the "Program" column of Table 1, in the row "Drain 160", the entry "0 V/V3" indicates 0 V for the selected bitline and a voltage V3 for the non-selected bitlines. Not all of the non-selected voltages are shown.

Figure 4:
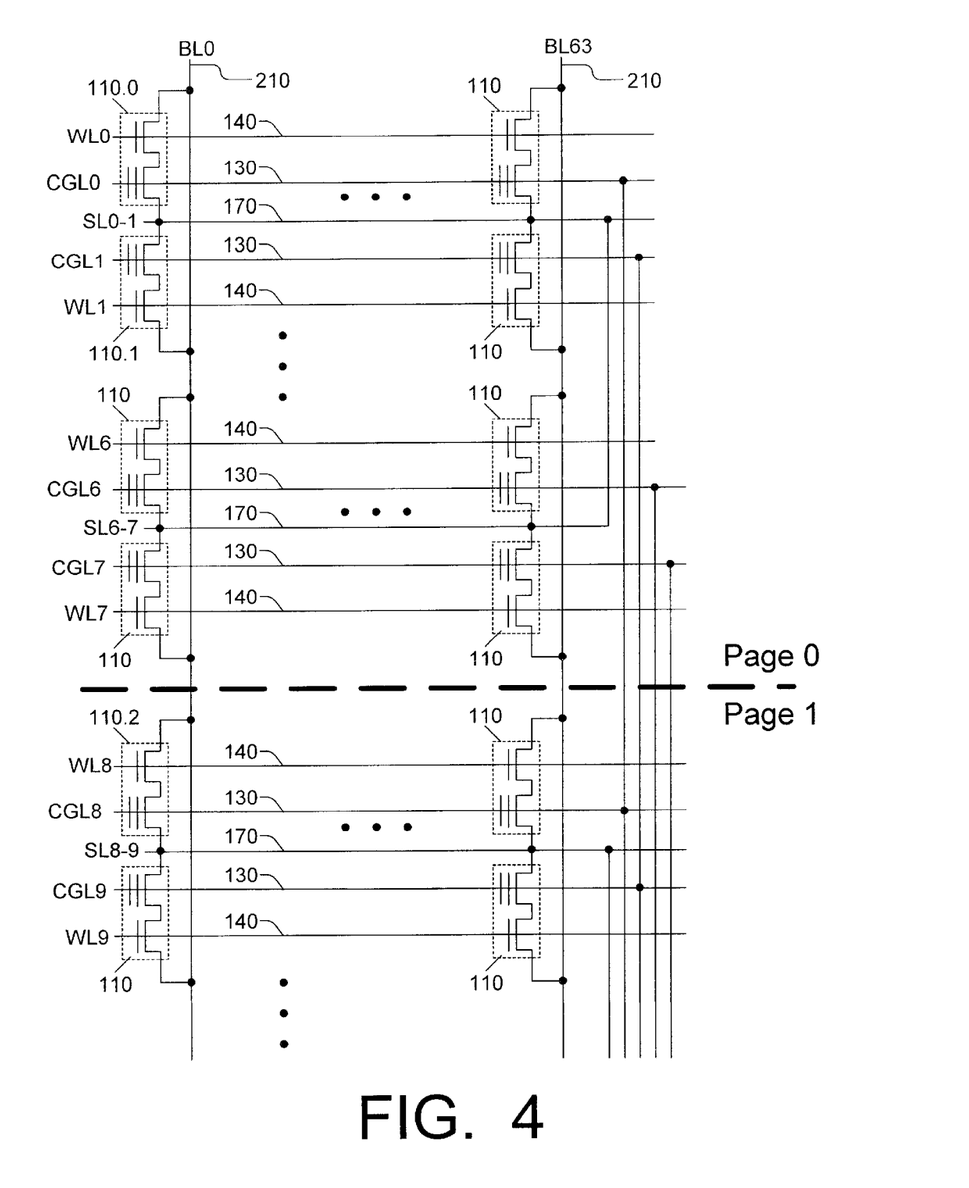
FIG. 4 is a block-circuit diagram of a memory array according to one embodiment of the present invention.

In some embodiments of the present invention, the punch-through probability is reduced by modifying the memory array. One embodiment is shown in FIG. 4. The memory array is similar to that of FIG. 2, with the source lines 170 connected together in each page of eight rows. Control gate lines 130 are also connected together, but not in the same page. For example, control gate line CGL0 in page 0 is connected to control gate line CGL8 in page 1, and can also be connected to one control gate line in each of pages 2, 3, 4, 5, 6, and 7. Control gate line CGL1 in page 0 is connected to control gate CGL9, and can also be connected to one control gate line in each of pages 2, 3, 4, 5, 6, and 7. Each control gate line CGL in page 0 can be connected to one control gate line in each of pages 1, 2, 3, 4, 5, 6, 7, and/or in some other pages. The control gate lines of the same page are not connected together. Now suppose that cell 110.0 (row 0, column 0) is selected for programming. Then cell 110.1 has both its control gate 130 and select gate 140 at 0 V, so the leakage current is smaller and the punch-through is less likely to occur. Cell 110.2 (row 8, column 0) has its control gate 130 at a high voltage, but its source 170 (line SL8-9) is at 0 V. Therefore, the source to drain voltage is 0 V, so the leakage current is 0 and the punch-through does not occur.

Other features and embodiments of the invention are described below. The invention is defined by the appended claims.

DESCRIPTION OF PREFERRED EMBODIMENTS

Figure 5:
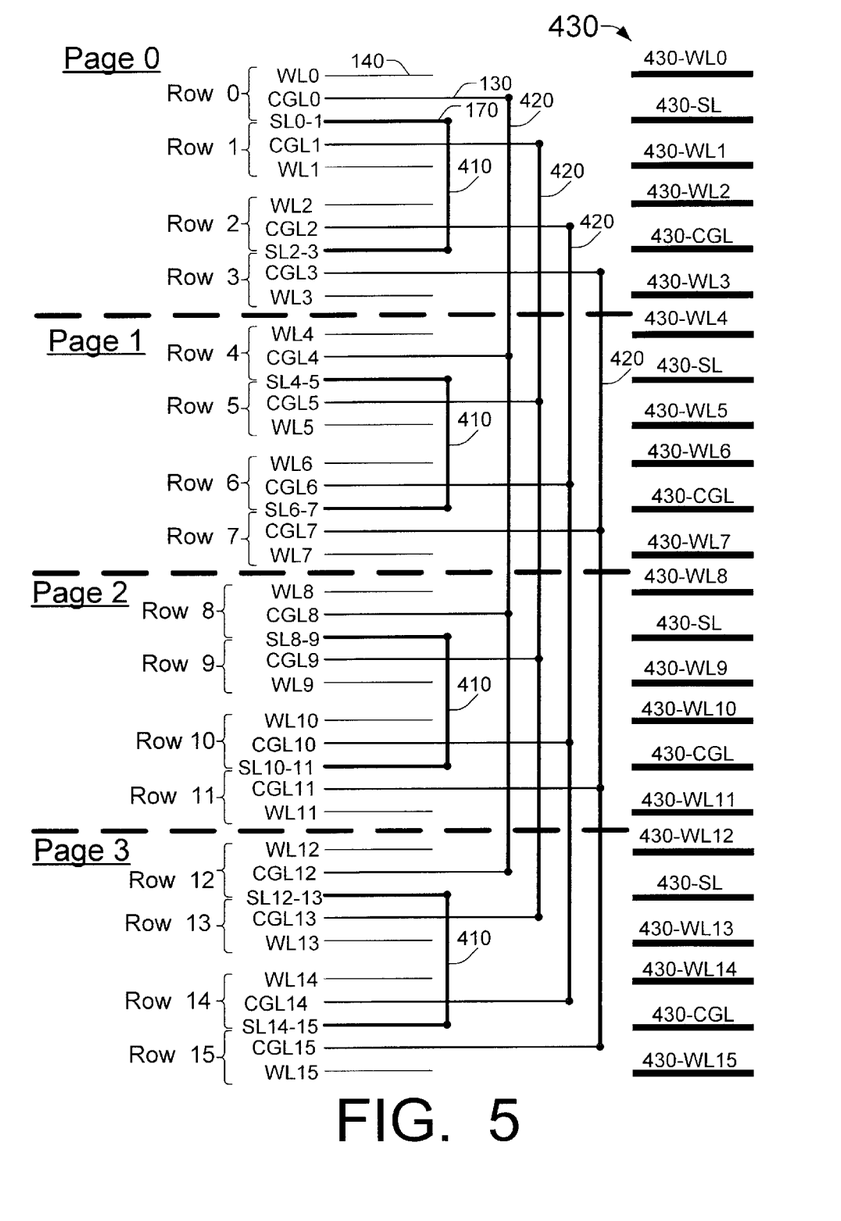
FIG. 5 is a circuit diagram showing some features of a memory array according to one embodiment of the present invention.

FIG. 5 illustrates another flash memory array according to the present invention. The memory cells and the bitlines are not shown. The memory cells can be as in FIG. 1 or 3, or of some other construction. Each memory cell has a floating gate, a control gate, and a select gate insulated from the floating and control gates. The select gates of each row "i" are provided by a respective wordline WLi, and the control gates of row "i" are provided by a control gate line CGLi, as in FIG. 2. Also as in FIG. 2, source regions 170 of each row are merged into a diffusion source line. Rows 0, 1 share source line SL0-1, rows 2, 3 share source line SL2-3, and so on. Drain regions 160 of each column (not shown) are connected to a corresponding bitline.

In the example of FIG. 5, each page has four rows. Page 0 has rows 0–3, page 1 has rows 4–7, and so on. Pages 0, 1, 2, 3 are shown, and other pages may be present. The two source lines of each page are connected together by lines 410. In some embodiments, wordlines 140 and control gate lines 130 are made of doped polysilicon layers as in FIGS. 1, 3. Lines 410 are made of a metal layer, e.g. tungsten. For ease of reference, we will call this metal layer "metal zero", or "metal 0". This can be the lowest metal layer in the integrated circuit. The invention is not limited to this layer being the lowest metal layer, or to this layer being a metal layer. Conductive silicides and other conductive materials can also be used. Also, a combination of conductive layers separated by dielectric layers can be used to form lines 410.

Control gate lines CGL are interconnected by lines 420. Each of these lines may be formed from the metal 0 layer or some other conductive layer or layers, and may interconnect four control gate lines in respective four different pages. In FIG. 5, one line 420 connects together the control gate lines 0, 4, 8, 12 (i.e. lines CGL0, CGL4, CGL8, CGL12); another line 420 connects together the control gate lines 1, 5, 9, 13; another line 420 connects together the control gate lines 2, 6, 10, 14; the fourth line 420 connects together the control gate lines 3, 7, 11, 15. In each page, at most one control gate line is driven with a high voltage during programming. The punch-through is therefore less likely to occur. (The programming, erase and read operations can be conducted with the voltages described above for the array of FIG. 2. The voltage values will generally depend on the particular memory cell structure, the dimensions of different features, the materials used, and perhaps other factors which may or may not be understood at this time. The voltage values given above are not limiting.) Strap lines 430 can be used to reduce the resistance between different portions of a control gate line 130, a wordline 140, or a source line 170. Each strap line 430 runs parallel to the control gate line, the wordline, or the source line, and is connected to the control gate line, the wordline or the source line at periodic intervals. In some embodiments, the resistivity, the sheet resistance, and the resistance per unit length of a strap line 430 is considerably lower (sometimes by a factor of 10, 100, or more) than the corresponding parameter (the resistivity, sheet resistance, resistance per unit length) of the corresponding control gate line, wordline, or source line. In some embodiments, control gate lines 130 and wordlines 140 are made of doped polysilicon, polycide, or metal silicide, each source line 170 is a region of doped monocrystalline silicon, and strap lines 430 are made of aluminum, copper, or metal silicide. Other materials can also be used.

In the aforementioned U.S. Pat. No. 6,134,144, one metal strap line is provided for each wordline, and one metal strap line is provided for each group of four source lines in a page of 8 rows each.

Whether or not any strap lines 430 are needed, depends on the conductivity and size of the control gate lines, the source lines, and the wordlines, as well as on timing requirements, the driving strength of the drivers driving these lines, and perhaps other parameters. In some embodiments, the resistance of control gate lines 130 is less important because during read operations, all of the control gate lines are held at a constant voltage (1.8 V in Table 1). In standby mode (i.e. when no rows are selected by the wordlines), the control gate lines are also held at this voltage. No strap lines 430 are provided for the control gate lines.

In other embodiments, the control gate lines are not held at a constant voltage. In standby mode, all of the control gate lines, the wordlines, the bitlines and the source lines are at the ground potential. The overall current leakage from the control gate lines to the ground terminal is therefore reduced. This is especially beneficial for high density memories (16 megabits or more on one chip) which require a low standby current in battery operated systems. In a read operation, the control gate line of the selected row is driven to a positive voltage, and the control gate lines that are not connected to the control gate line of the selected row are grounded. Strap lines 430 are provided for the control gate lines to allow the control gate lines to be quickly driven to the appropriate voltages during the read operations.

It is desirable to reduce the area taken by strap lines 430, especially if all of the strap lines are made from a single layer. In some embodiments, all strap lines 430 are made from a metal 1 layer (the next metal layer after metal 0; the metal 0 and metal 1 layers are separated from each other by a dielectric).

In FIG. 5, one strap line 430 is provided for each wordline. Wordline WL0 is connected to strap line 430-WL0, wordline WL1 to strap line 430-WL1, and so on. In each page, one strap line 430-SL is provided for the two source lines 170, and one strap line 430-CGL is provided for a respective group of four control gate lines 130. In page 0, strap line 430-SL overlies source line SL0-1. Strap line 430-CGL overlies source line SL2-3. The strap line positioning in the other pages is similar.

The invention is not limited to the order or layout of the strap lines, or to the strap lines being made from one layer.

Figure 6:
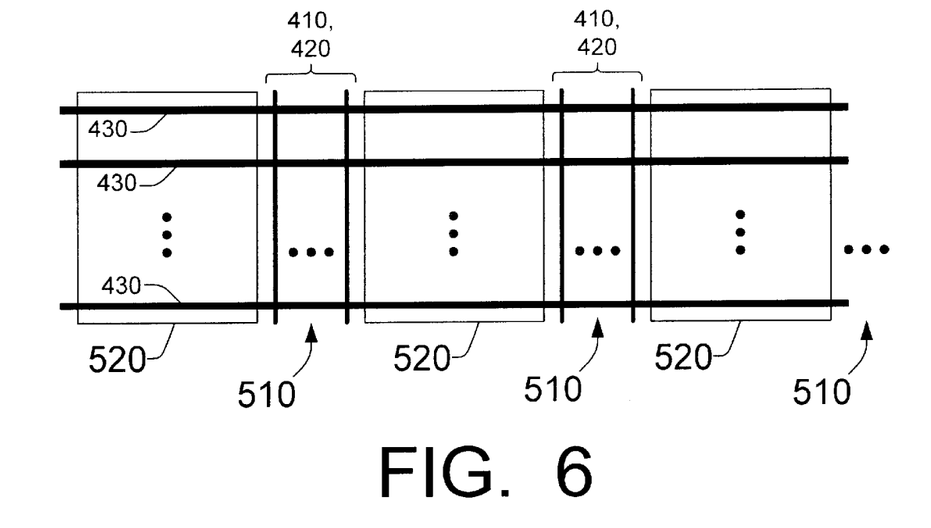
FIG. 6 is a block-circuit diagram of a memory array according to one embodiment of the present invention.

FIG. 6 illustrates an exemplary layout of metal lines 410, 420, 430. The memory array is divided into sections 520 by gaps 510. Each section 520 consists of a number of columns of the array (a number of bitlines), but there are no bitlines in gaps 510. The gaps contain the metal 0 lines 410, 420 extending in the bitline direction. Each gap may contain a complete set of four lines 410 and four lines 420 for each group of four pages (see FIG. 5), or a gap may contain a subset of the complete set of lines. The wordlines, source lines, and control gate lines run through sections 520 and may or may not be interrupted in the gaps. Metal 1 strap lines 430 traverse the entire array; they are not interrupted in the gaps. Alternatively, the lines 430 may be interrupted in a gap 510 or a section 520, and the wordlines, the source lines, and the control gate lines may run uninterrupted through the gaps. A strap line 430 may contact the corresponding wordline, source line, or control gate line in each gap or in only some of the gaps. The contact can be made through the metal 0 layer.

Figure 7:
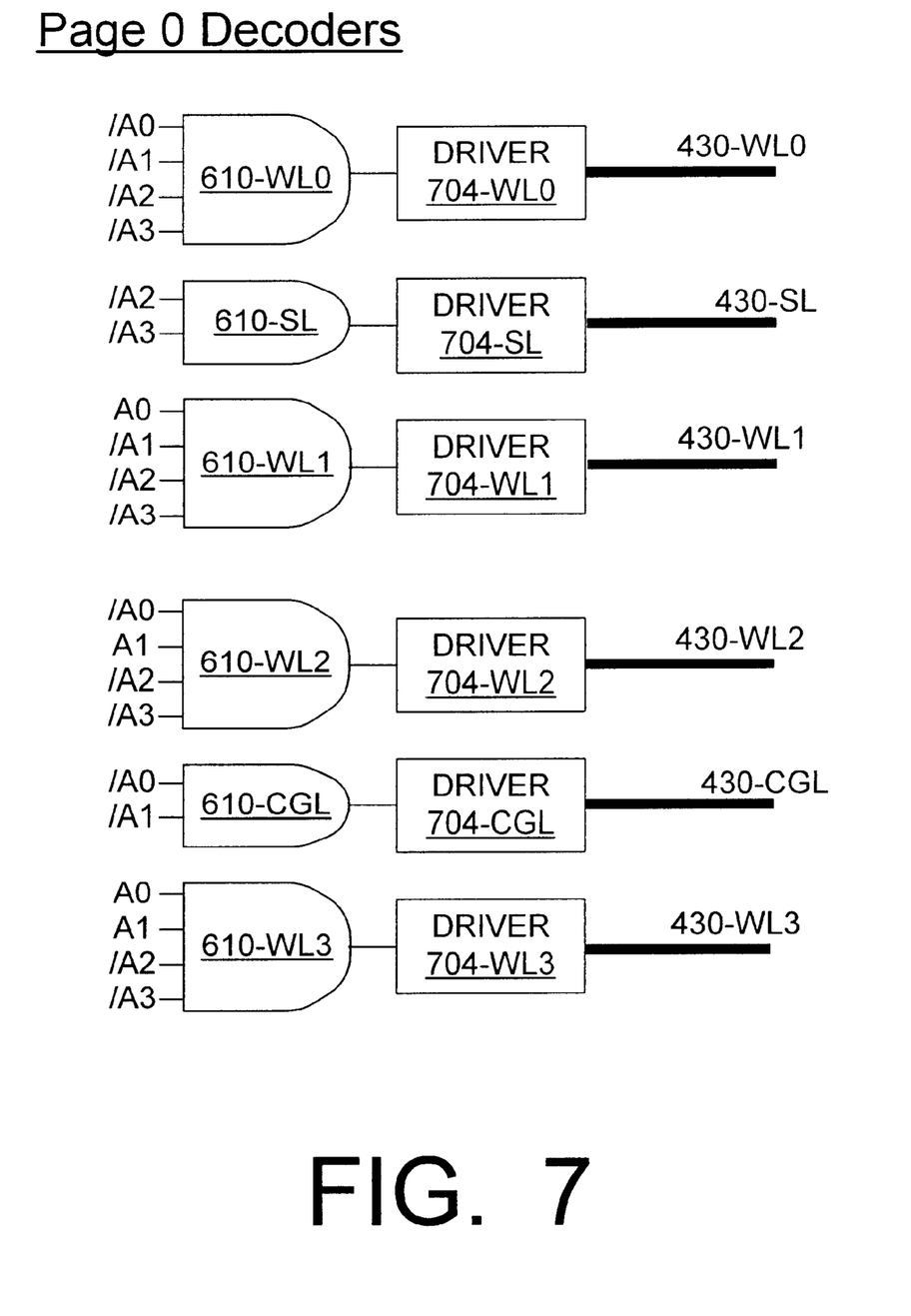
FIG. 7 is a circuit diagram showing decoder circuitry according to one embodiment of the present invention.

FIG. 7 illustrates row decoder circuitry for page 0. The term "decoder" denotes a circuit that receives address information and generates a signal to activate a control gate line, a wordline, or some other feature of the array. In FIG. 7, each decoder 610 is shown as an AND gate. The decoder can be connected to a wordline or some other feature directly, or the decoder can be coupled to the wordline or other feature through a strap line 430 and/or a driver 704. For example, decoder 610-WL0 is coupled to strap line 430-WL0 through driver 704-WL0, decoder 610-SL is coupled to strap line 430-SL through driver 704-SL, and so on. The drivers can generate appropriate voltages, such as a super high voltage for a control gate line. The decoders of FIG. 7 are used for the programming operation. The same decoders can also be used for reading or other operations. Drivers 704 receive signals indicating the kind of operation being preformed, and the drivers generate appropriate voltages. Alternatively, separate decoders can be used for different kinds of operations.

In FIG. 7, one decoder is provided for each strap line 430. Decoders 610-WL0, 610-WL1, 610-WL2, 610-WL3 are coupled to respective strap lines 430-WL0, 430-WL1, 430-WL2, 430-WL3. Decoder 610-SL is coupled to strap line 430-SL. Decoder 610-CGL is coupled to strap line 430-CGL.

Address bits A0, A1, A2, A3 select one of 16 rows in pages 0–3. Other address bits (not shown) select the pages 0–3 or some other group of four pages having their control gate lines interconnected. Address bits A0, A1 select one of 4 wordlines within a page. Address bits A2, A3 select a page within a group of four pages. Page 0 is selected when A2=A3=0. Source line decoder 610-SL is shown as a 2-input AND gate with its inputs tied to /A2, /A3 (the inverse of A2, A3).

Each word line decoder 610-WLi (i=0, 1, 2, 3) is shown as a 4-input AND gate. Two of the inputs receive the signals /A2, /A3. The other two inputs receive one of the four combinations of signals (A0, A1), (/A0, A1), (A0, /A1), (/A0, /A1).

Bits A0, A1 select one of four control gate strap lines 430-CGL in pages 0–3. Decoder 610-CGL for page 0 is shown as a 2-input AND gate receiving the signals /A0, /A1.

The invention is not limited to any particular decoder implementation or use of address bits. The decoders may have additional inputs for receiving a signal selecting the pages 0–3, a signal indicating a programming operation, and perhaps other signals.

The particular features of FIGS. 4–7 are provided for illustration and are not limiting. For example, the control gate lines CGL do not have to be interconnected in groups of 4. They can be interconnected in groups of 2. For example, in FIG. 5, line CGL0 (page 0) can be connected to line CGL4 (page 1), but not to the control gate lines in pages 2 and 3. Control gate lines CGL can be interconnected in groups of 3, 5, or some other number. In one embodiment, one control gate line in each page is connected to one control gate line in every other page. (We use the term "page" to denote a group of rows which have their source regions 170 connected together.) The number of control gate line decoders 610-CGL and strap lines 430-CGL may be increased.

Figure 8A:
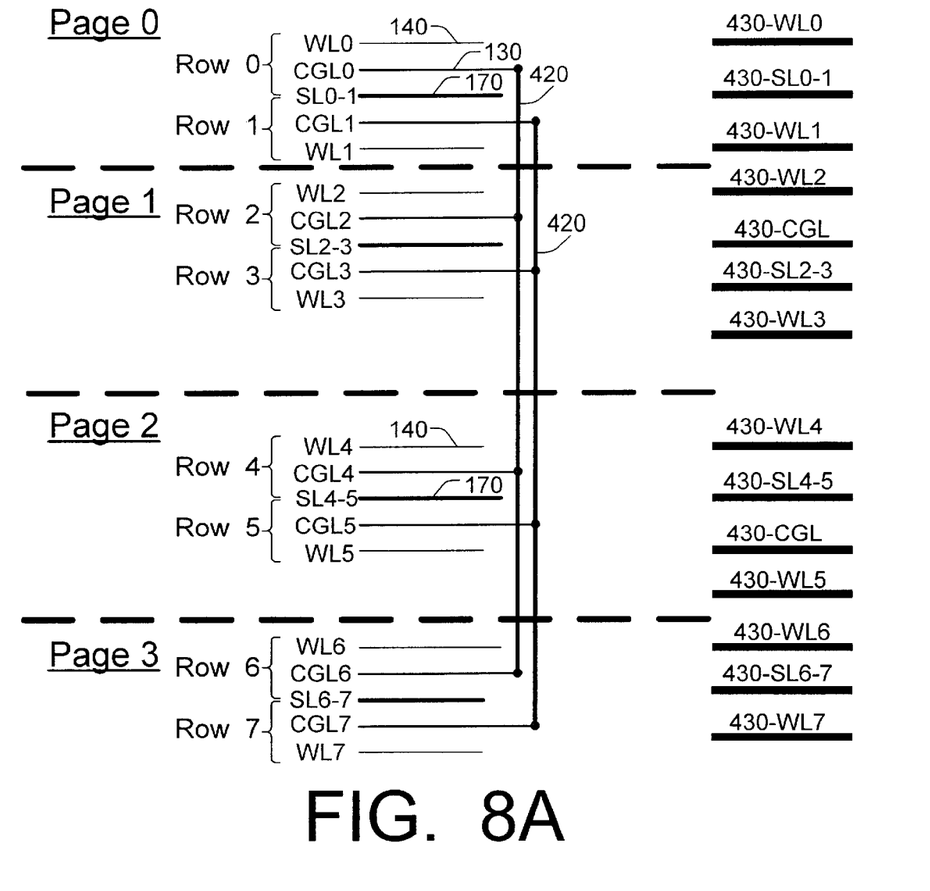
FIG. 8A is a circuit diagram showing some features of a memory array according to one embodiment of the present invention.
Figure 8B:
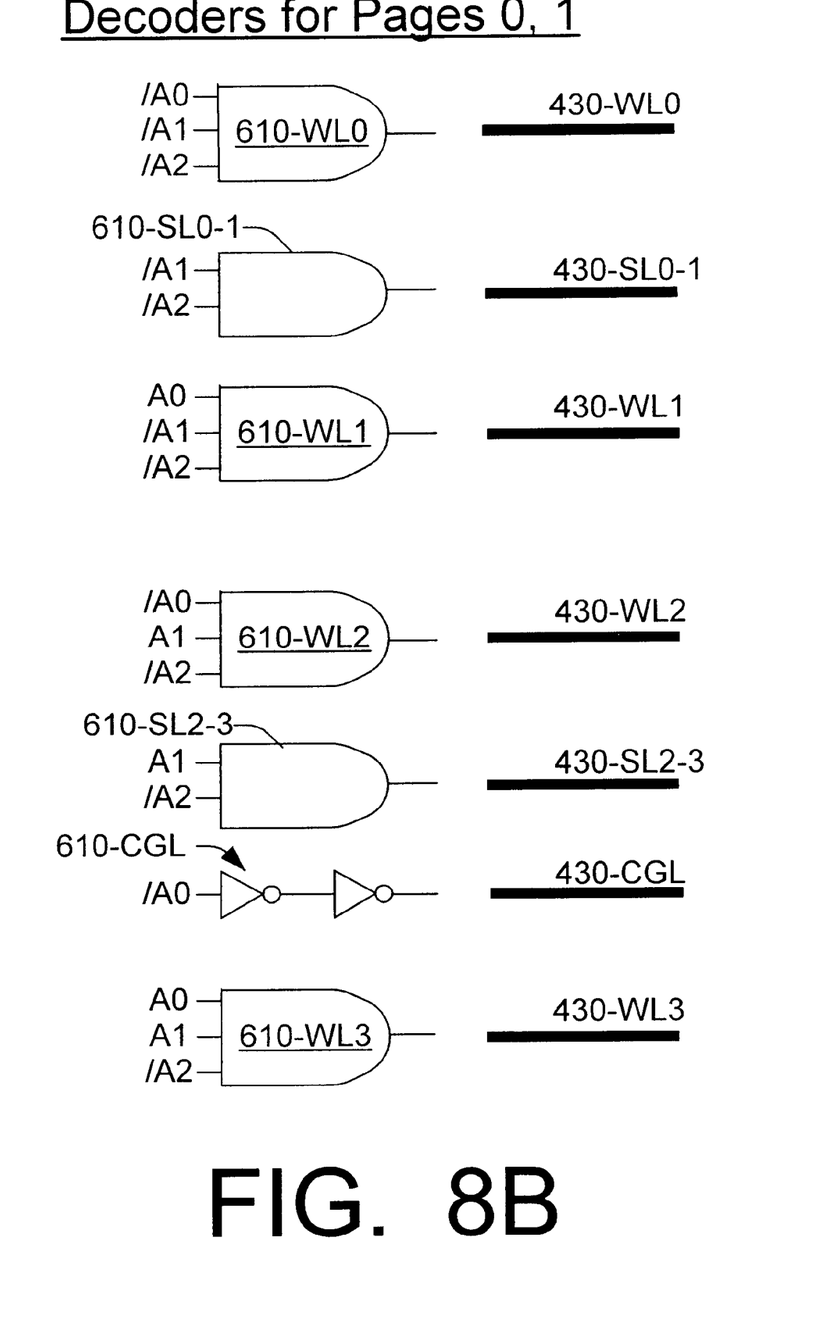
FIG. 8B is a circuit diagram showing decoder circuitry according to one embodiment of the present invention.

The invention is not limited to any particular number of rows in a page. A page may have eight rows as in FIG. 2, or only two rows whose source regions are connected together (for example, the two rows may share a source line). FIGS. 8A, 8B show such an example. Different source lines are not connected together, so the lines 410 are omitted. Control gate lines CGL are connected in groups of 4 by lines 420. Lines CGL0, CGL2, CGL4, CGL6 are connected together, and lines CGL1, CGL3, CGL5, CGL7 are connected together.

In FIG. 8A, one strap line 430 is provided for each wordline, as in FIG. 5. Also, in FIG. 8A one strap line 430-CGL is provided for each group of control gate lines CGL that are connected together. In addition, one strap line 430 is provided for each source line: strap line 430-SL0-1 for source line SL0-1, strap line 430-SL2-3 for source line SL2-3, and so on.

FIG. 8B illustrates the row decoders for pages 0 and 1. In this example, address bits A0, A1, A2 select one of 8 rows in pages 0–3. Decoders 610-WL0, 610-WL1, 610-WL2, 610-WL3 are coupled to drive respective strap lines 430-WL0, 430-WL1, 430-WL2, 430-WL3. Decoders 610-SL0-1, 610-SL2-3 are coupled to respective strap lines 430-SL0-1, 430-SL2-3. Decoder 610-CGL is coupled to strap line 430-CGL.

Address bits A0, A1, A2 select a wordline within a group of 4 pages having their control gate lines interconnected, such as pages 0–3. In pages 0 and 1, A2=0. Address bits A1, A2 select a page within the group of four pages, and these bits select the corresponding source line (there is one source line per page). Page 0 is selected when A1=A2=0. Page 1 is selected when A1=1 and A2=0. Source line decoder 610-SL0-1 is shown as a 2-input AND gate with its inputs receiving the signals /A1, /A2. Source line decoder 610-SL2-3 is shown as a 2-input AND gate with its inputs receiving the signals A1, /A2.

Each word line decoder 610-WLi (i=0, 1, 2, 3) is shown as a 3-input AND gate. Two of the inputs receive signals /A1, /A2 (for page 0) or A1, /A2 (for page 1). The third input receives signal A0 or /A0.

Bit A0 selects one of the two strap lines 430-CGL in the group of 4 pages. Control gate line decoder 610-CGL is shown as two inverters connected in series that receive the signal /A0.

The invention is not limited to the embodiments described above. In particular, the invention is not limited to memories with strap lines 430, or any particular layout of the strap lines or the decoders, or any other particulars. In some embodiments, source lines SL are absent; source regions 170 within each row are connected together by a conductive line formed from another layer (e.g. doped polysilicon). Similarly, control gates 130 within each row do not have to be part of a continuous line, the control gates can be connected together by some other layer. Similarly, select gates 140 can be connected together by some other layer.

Figure 9:
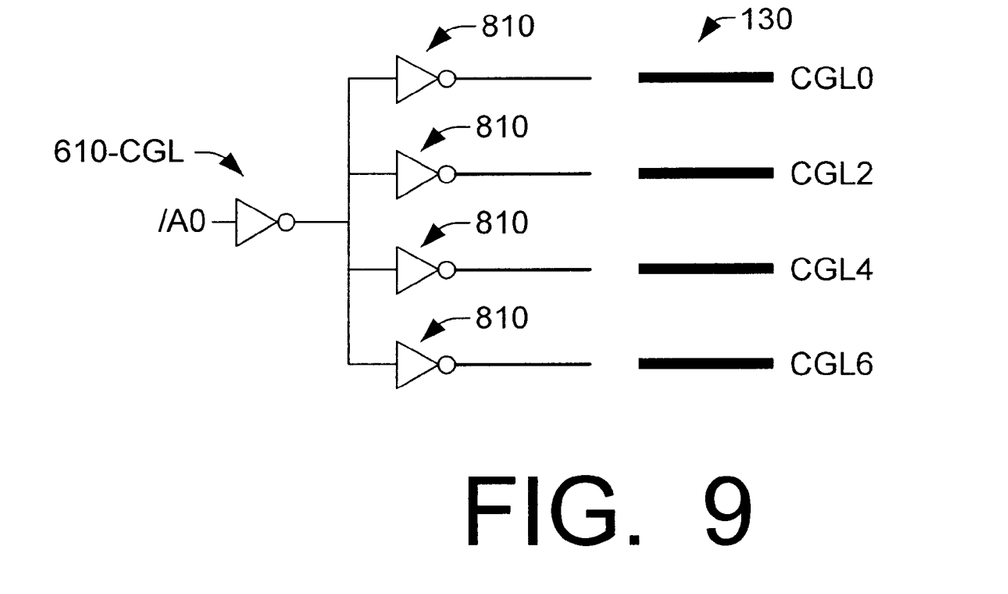
FIG. 9 is a circuit diagram showing decoder circuitry according to one embodiment of the present invention.

Moreover, different control gates can be driven into the same state without being connected together, as shown in FIG. 9. Here control gate lines CGL0, CGL2, CGL4, CGL6 are coupled to the output of decoder 610-CGL through respective inverters 810 (and possibly through strap lines 430).

In this description, a statement that two nodes or features are connected to each other covers the possibility that the two nodes or features are merged into one. For example, in FIG. 3, the source regions 170 of cells 110 are connected to each other in the sense that their regions 170 are merged into one so the cells share a source region.

The invention is not limited to the programming being carried out by hot electron injection from the side of drain 160, or to any particular erase mechanism. The invention is applicable to non-flash EEPROMs (electrically erasable and programmable read only memories), and to memories that may be electrically programmable but not electrically erasable. The invention is applicable to one time programmable memories. The invention is not limited to the programming operation. Some embodiments involve erase operations or other memory access operations. The terms "source" and "drain" can be used interchangeably. The invention is not limited by any particular terminology.

The invention is not limited to silicon or any other materials, or to particular N or P conductivity types. For example, source 170 and drain 160 can be P type regions. embodiments and variations are within the scope of the invention, as defined by the ed claims.

What is claimed is:

1. A circuit comprising:
   a plurality of rows of nonvolatile memory cells, each memory cell having a first semiconductor region, a first gate for controlling a conductivity of the first semiconductor region, a second gate insulated from the first gate, and a first node through which a current flows to or from the first semiconductor region;
   circuitry for driving the first and second gates and the first nodes into respective states to perform a first memory access operation to access one or more memory cells, wherein during the first access operation:
   (a) the first gates within each row are in the same state, the second gates within each row are in the same state, and the first nodes within each row are in the same state;
   (b) the first gates within each row being accessed are in a different state than the first gates of each row not being accessed;
   (c) for some row RI being accessed and some rows R2, R3 which are not being accessed, the second gates of the rows R1, R2 are in the same state, the first nodes of the rows R1, R3 are in the same state, but the second gates of the rows R1, R3 are not in the same state.

2. The circuit of claim 1 wherein the first nodes are semiconductor regions, and the first nodes of the row R1 are shared with the row R3.

3. The circuit of claim 1 wherein the first access operation is a write operation.

4. The circuit of claim 3 wherein each first node is a first source/drain region, and each memory cell further comprises:
   a floating gate insulated from said semiconductor region; and
   a second source/drain region adjacent to the channel region; and
   the write operation comprises, with respect to a memory cell being written, driving the second gate and the first source/drain region to positive voltages relative to the second source/drain region, to inject electrons into the floating gate of the memory cell.

5. The circuit of claim 1 wherein the memory cells form an array, each first node of each cell is a first source/drain region of the cell, each cell has a second source drain region, and the second source/drain regions within each column of the array are connected together.

6. The circuit of claim 1 wherein:
   the second gates of each row a provided by a conductive line L1; and the circuit further comprises a plurality of conductive lines L2 each of which is connected to at least one of the lines L1, the lines L2 having a lower resistance per unit length than the lines L1.

7. The circuit of claim 6 wherein each line L2 is connected to at least one of the lines L1 at two or more places.

8. The circuit of claim 6 further comprising a plurality of decoders which respond to address signals and generate signals defining the states of the second gates during a read operation, such that the second gates of at least one row selected for the read operation are in a different state than the second gates of at least one row not selected for the read operation.

9. The circuit of claim 1 wherein:

the plurality of rows are rows of a memory array;

the first access operation is a write operation; and in each first access operation:
 (i) only one row R1 of the memory array is accessed;
 (ii) for each row R≠R1 whose first nodes are in the same state as the first nodes of the row R1, the second gates of the row R are not in the same state as the second gates of the row R1.

10. A semiconductor integrated circuit comprising a plurality of rows of nonvolatile memory cells, each memory cell having a first source/drain region, a second source/drain region, a semiconductor region between the first and second source/drain regions, a select gate, a control gate, and a floating gate;

wherein within each row of the memory cells (a) all of the first source/drain regions are connected together, (b) all of the select gates are connected together, and (c) all of the control gates are connected together;

wherein the first source/drain regions of each row are connected to the first source/drain regions of at least one other row, and the control gates of each row are connected to the control gates of at least one other row, but any two rows that have their control gates connected together do not have their first source/drain regions connected together.

11. The circuit of claim 10 wherein the memory cells form an array, and the second source/drain regions of each column of the array are connected together.

12. The circuit of claim 10 wherein the first source/drain regions of each row are shared with the first source/drain regions of at least one other row.

13. The circuit of claim 10 wherein:

the control gates of each row are provided by a conductive line L1; and the circuit further comprises a plurality of conductive lines L2 each of which is connected to at least one of the lines L1, the lines L2 having a lower resistance per unit length than the lines L1.

14. The circuit of claim 13 wherein each line L2 is connected to at least one of the lines L1 at two or more places.

15. The circuit of claim 13 further comprising a plurality of decoders which respond to address signals and generate signals defining the states of the control gates during a read operation, such that the control gates of at least one row selected for the read operation are in a different state than the control gates of at least one row not selected for the read operation.

* * * * *